(12) United States Patent
Luijten et al.

(10) Patent No.: US 8,427,629 B2
(45) Date of Patent: *Apr. 23, 2013

(54) LITHOGRAPHIC APPARATUS AND DEVICE MANUFACTURING METHOD

(75) Inventors: Carlo Cornelis Maria Luijten, Duizel (NL); Sjoerd Nicolaas Lambertus Donders, 's-Hertogenbosch (NL); Nicolaas Rudolf Kemper, Eindhoven (NL); Martinus Hendrikus Antonius Leenders, Rotterdam (NL); Erik Roelof Loopstra, Heeze (NL); Bob Streefkerk, Tilburg (NL); Marcel Beckers, Eindhoven (NL); Herman Boom, Eindhoven (NL); Richard Moerman, Son (NL)

(73) Assignee: ASML Netherlands B.V., Veldhoven (NL)

( * ) Notice: Subject to any disclaimer, the term of this patent is extended or adjusted under 35 U.S.C. 154(b) by 198 days.

This patent is subject to a terminal disclaimer.

(21) Appl. No.: 12/871,631

(22) Filed: Aug. 30, 2010

(65) Prior Publication Data

US 2010/0321651 A1 Dec. 23, 2010

Related U.S. Application Data

(63) Continuation of application No. 12/340,362, filed on Dec. 19, 2008, now Pat. No. 7,808,614, which is a continuation of application No. 10/948,749, filed on Sep. 24, 2004, now Pat. No. 7,522,261.

(51) Int. Cl.
*G03B 27/42* (2006.01)
*G03B 27/58* (2006.01)
*G03B 27/32* (2006.01)
*G03B 27/52* (2006.01)

(52) U.S. Cl.
USPC ............... 355/53; 355/30; 355/72; 355/77

(58) Field of Classification Search ............... 355/30, 355/52, 53, 55, 67–71, 72–74, 77; 250/492.1, 250/492.2, 492.22, 493.1, 548; 430/22, 30, 430/311, 312, 325

See application file for complete search history.

(56) References Cited

U.S. PATENT DOCUMENTS 3,573,975 A 4/1971 Dhaka et al.
3,648,587 A 3/1972 Stevens
(Continued)

FOREIGN PATENT DOCUMENTS

DE 206 607 2/1984
DE 221 563 4/1985
(Continued)

OTHER PUBLICATIONS

Japanese Office Action mailed Mar. 23, 2012 in corresponding Japanese Patent Application No. 2009-033850.

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

An immersion lithographic projection apparatus has a liquid confinement structure configured to at least partly confine liquid to a space between a projection system and a substrate, the confinement structure having a buffer surface, when in use, positioned in close proximity to a plane substantially comprising the upper surface of the substrate and of a substrate table holding the substrate, to define a passage having a flow resistance. A recess is provided in the buffer surface, the recess, when in use, being normally full of immersion liquid to enable rapid filling of a gap between the substrate and substrate table as the gap moves under the buffer surface. The recess may be annular or radial and a plurality of recesses may be provided.

20 Claims, 5 Drawing Sheets

U.S. PATENT DOCUMENTS

| | | | |
|---|---|---|---|
| 4,346,164 | A | 8/1982 | Tabarelli et al. |
| 4,390,273 | A | 6/1983 | Loebach et al. |
| 4,396,705 | A | 8/1983 | Akeyama et al. |
| 4,480,910 | A | 11/1984 | Takanashi et al. |
| 4,509,852 | A | 4/1985 | Tabarelli et al. |
| 5,040,020 | A | 8/1991 | Rauschenbach et al. |
| 5,610,683 | A | 3/1997 | Takahashi |
| 5,715,039 | A | 2/1998 | Fukuda et al. |
| 5,825,043 | A | 10/1998 | Suwa |
| 5,900,354 | A | 5/1999 | Batchelder |
| 6,191,429 | B1 | 2/2001 | Suwa |
| 6,236,634 | B1 | 5/2001 | Lee et al. |
| 6,560,032 | B2 | 5/2003 | Hatano |
| 6,600,547 | B2 | 7/2003 | Watson et al. |
| 6,603,130 | B1 | 8/2003 | Bisschops et al. |
| 6,633,365 | B2 | 10/2003 | Suenaga |
| 6,809,794 | B1* | 10/2004 | Sewell ............................ 355/30 |
| 6,954,256 | B2 | 10/2005 | Flagello et al. |
| 7,394,521 | B2 | 7/2008 | Van Santen et al. |
| 7,397,532 | B2 | 7/2008 | Novak |
| 2002/0020821 | A1 | 2/2002 | Van Santen et al. |
| 2002/0163629 | A1 | 11/2002 | Switkes et al. |
| 2003/0123040 | A1 | 7/2003 | Almogy |
| 2003/0169407 | A1 | 9/2003 | Hasegawa et al. |
| 2003/0174408 | A1 | 9/2003 | Rostalski et al. |
| 2004/0000627 | A1 | 1/2004 | Schuster |
| 2004/0021844 | A1 | 2/2004 | Suenaga |
| 2004/0075895 | A1 | 4/2004 | Lin |
| 2004/0109237 | A1 | 6/2004 | Epple et al. |
| 2004/0114117 | A1 | 6/2004 | Bleeker |
| 2004/0119954 | A1 | 6/2004 | Kawashima et al. |
| 2004/0125351 | A1 | 7/2004 | Krautschik |
| 2004/0135099 | A1 | 7/2004 | Simon et al. |
| 2004/0136494 | A1 | 7/2004 | Lof et al. |
| 2004/0160582 | A1* | 8/2004 | Lof et al. ...................... 355/30 |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2004/0263809 | A1 | 12/2004 | Nakano |
| 2005/0007569 | A1* | 1/2005 | Streefkerk et al. ............ 355/30 |
| 2005/0110973 | A1 | 5/2005 | Streefkerk et al. |
| 2005/0132914 | A1 | 6/2005 | Mulkens et al. |
| 2005/0219488 | A1 | 10/2005 | Nei et al. |
| 2005/0259234 | A1* | 11/2005 | Hirukawa et al. ............. 355/53 |
| 2005/0286032 | A1 | 12/2005 | Lof et al. |
| 2006/0023181 | A1* | 2/2006 | Novak ............................ 355/53 |
| 2006/0023182 | A1* | 2/2006 | Novak et al. .................. 355/53 |
| 2006/0038968 | A1 | 2/2006 | Kemper et al. |
| 2006/0087630 | A1* | 4/2006 | Kemper et al. ................ 355/30 |
| 2006/0152697 | A1 | 7/2006 | Poon et al. |
| 2006/0261288 | A1* | 11/2006 | Van Santen ............... 250/492.1 |
| 2007/0195303 | A1* | 8/2007 | Poon et al. ..................... 355/53 |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1 571 695 A1 | 9/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-165666 | 6/2004 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004053955 A1 * | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004055803 A1 * | 7/2004 |
| WO | WO 2005/024517 A2 | 3/2005 |

OTHER PUBLICATIONS

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc SPIE 5040 (2003).

Nikon Precision Europe GmbH, "Investor Relations—Nikon's Real Solutions", May 15, 2003.

H. Kawata et al. "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide No. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

Lin, The $k_3$ coefficient in nonParaxial λ/NA scaling equations for resolution, depth of focus, and immersion lithography, *J. Microlith., Microfab., Microsyst.* 1(1):7-12 (2002).

English Translation of WO 2004/053955, dated Jun. 24, 2004.

English Translation of JP 2005-101488, dated Apr. 14, 2005.

Reissue U.S. Appl. No. 10/367,910 of U.S. Patent No. 6,191,429, filed Feb. 19, 2003.

Notice of Reasons for Rejection for Japanese Patent Application No. 2005-275937 dated Nov. 17, 2008.

* cited by examiner

Fig. 2
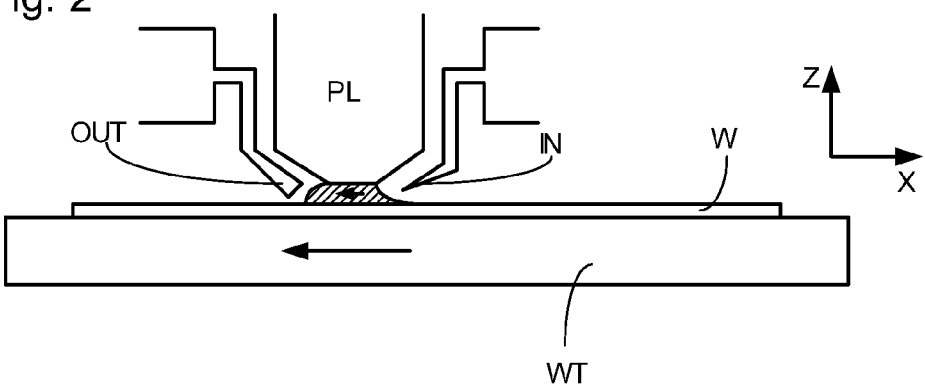
Fig. 3
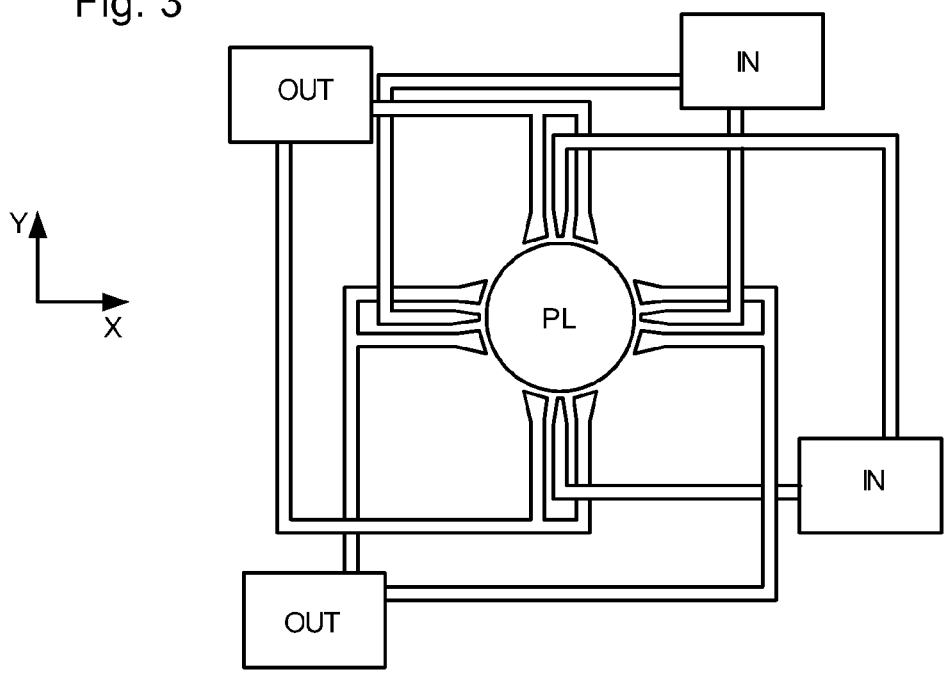
Fig. 4
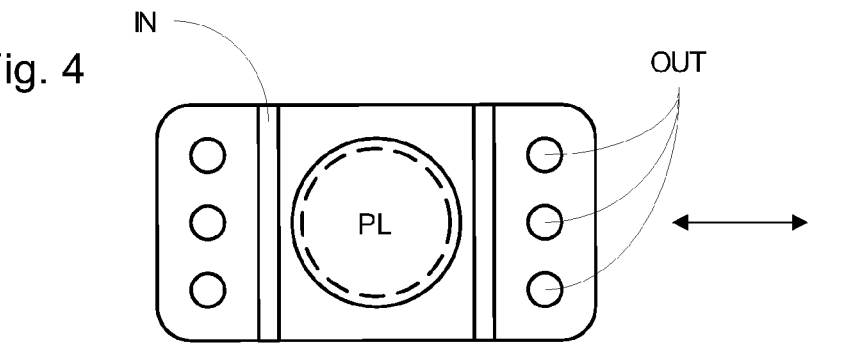
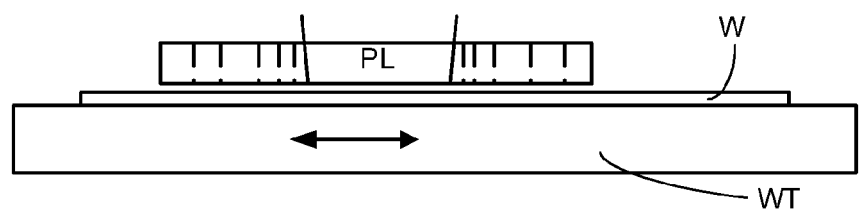

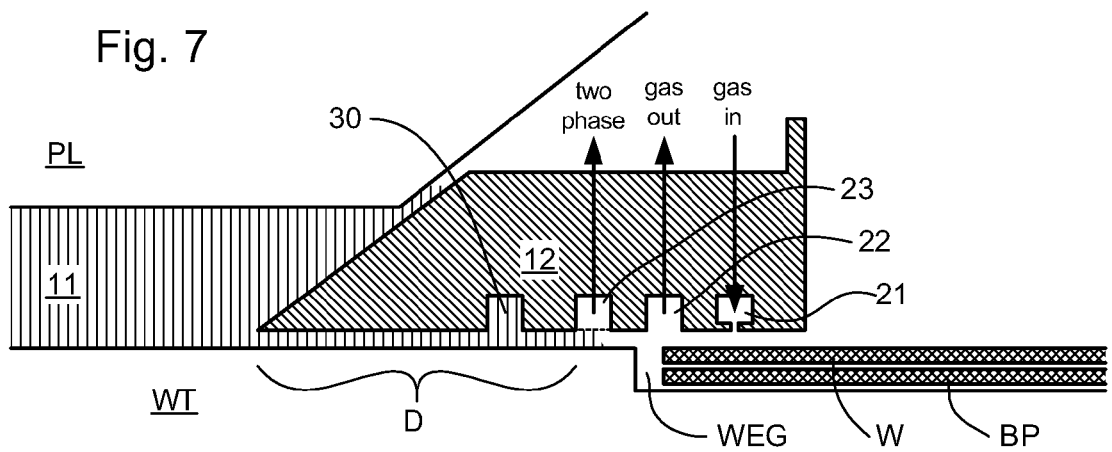
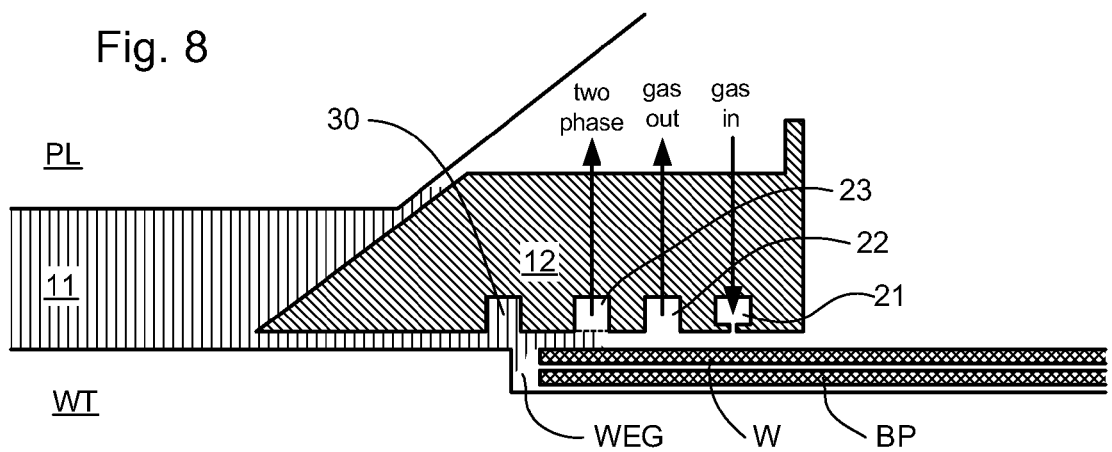
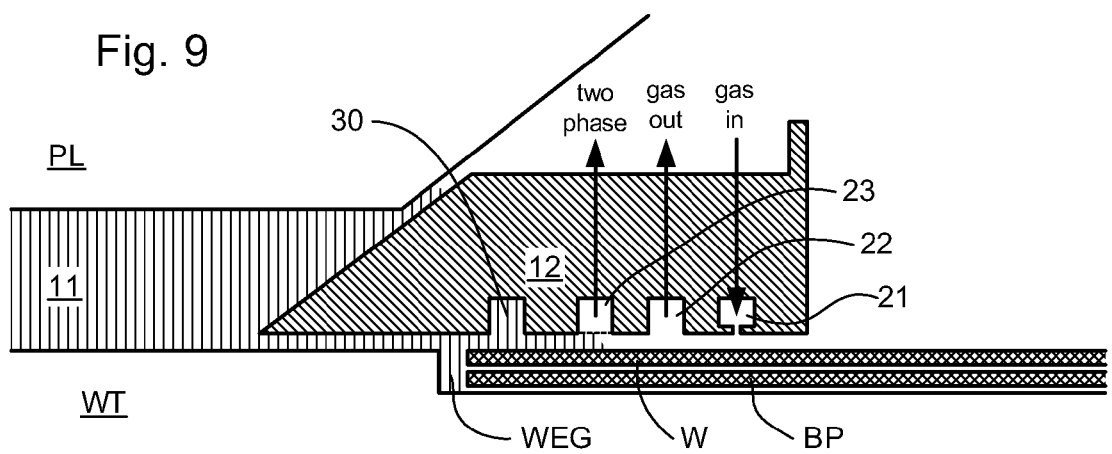

LITHOGRAPHIC APPARATUS AND DEVICE MANUFACTURING METHOD

The present application is a continuation of U.S. patent application Ser. No. 12/340,362 filed on Dec. 19, 2008, now allowed, which is a continuation of U.S. patent application Ser. No. 10/948,749 filed on Sep. 24, 2004, now U.S. Pat. No. 7,522,261. The entire contents of each of the foregoing applications is herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

When an immersion lithographic apparatus is used, bubbles in the immersion liquid may cause manufacturing defects if those bubbles are present in the exposure field or the path of the projection beam during exposure. Bubbles at or close to the substrate surface print as hard defects that are generally serious enough to render a device unusable while bubbles that are floating freely in the path of the projection beam can cause illumination non-uniformity and CD variation. The presence of more than a few bubbles per layer per substrate can therefore reduce the yield of correctly functioning devices substantially.

SUMMARY

Accordingly, it would be advantageous, for example, to provide an immersion lithographic apparatus in which the generation of bubbles in the immersion liquid is reduced.

According to an aspect of the invention, there is provided a lithographic projection apparatus arranged to project a patterned beam of radiation from a patterning device, through a liquid, onto a substrate, the apparatus comprising:
 a projection system configured to project the patterned beam of radiation onto the substrate; and
 a liquid confinement structure configured to at least partly confine the liquid to a space between the projection system and the substrate, wherein the confinement structure has a buffer surface positioned, when in use, in close proximity to a plane substantially comprising the upper surface of the substrate and of a substrate table configured to hold the substrate, to define a passage having a flow resistance, the buffer surface comprising a recess, said recess when in use, being normally full of liquid to enable rapid filling of a gap between the substrate and the substrate table as the gap moves under the buffer surface.

According to an aspect of the invention, there is provided A device manufacturing method, comprising:
 confining liquid to a space between a projection system of a lithographic projection apparatus and a substrate using a liquid confinement structure of the lithographic projection apparatus, the confinement structure having a buffer surface positioned in close proximity to a plane substantially comprising the upper surface of the substrate and of a substrate table holding the substrate, to define a passage having a flow resistance;
 providing liquid in a recess in the buffer surface to enable rapid filling of a gap between the substrate and the substrate table as the gap moves under the buffer surface; and projecting a patterned beam of radiation, using the projection system, through liquid in the space onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

FIGS. 7 to 9 depict in section the immersion hood of an embodiment of the invention passing over the substrate edge gap;

DETAILED DESCRIPTION

Figure 1:
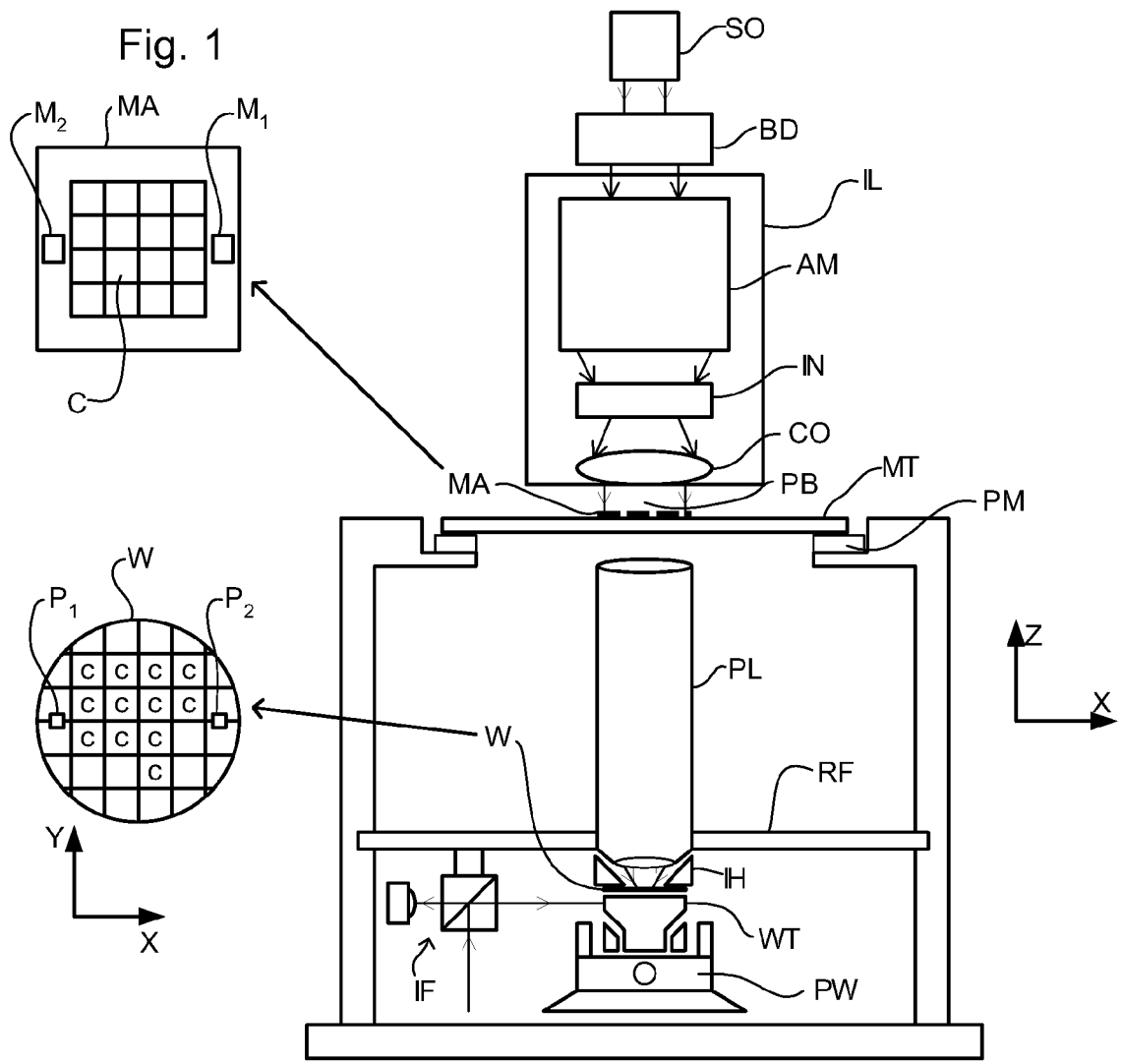
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference, and shown in FIG. 5.

Figure 5:
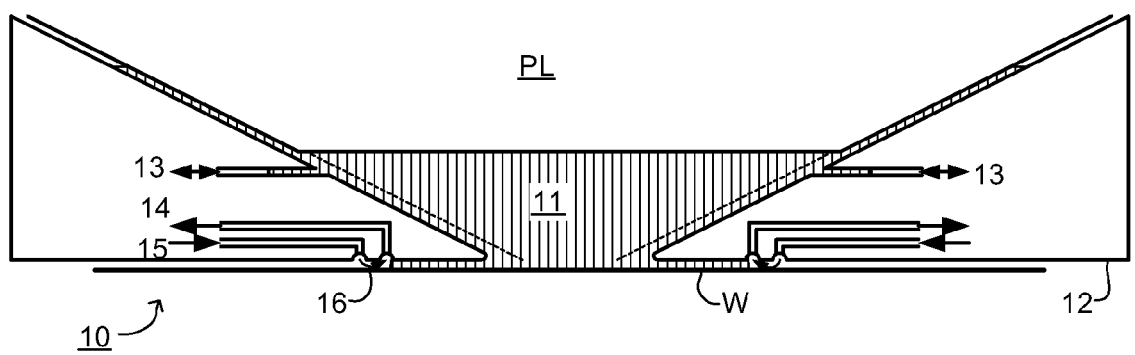
FIG. 5 depicts a further liquid supply system for use in a lithographic projection apparatus.

As shown in FIG. 5, the reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air or $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table The liquid supply system IH, also referred to as the immersion hood, is shown schematically in plan in FIG. 6 and in vertical cross-section in FIGS. 7 to 9, approaching the gap WEG between the substrate W and the upper surface of the substrate table WT. The immersion hood IH may be the same as that described above in relation to FIG. 5, save as described below, and a further description of the common aspects is omitted for brevity.

As shown in FIGS. 7 to 11, the substrate is placed on a burl plate BP (also variously referred to as a pimple plate, substrate holder or chuck) in a recess (sometimes referred to as a pothole) in the substrate table. To allow for variation in the size of the substrate and in the placement of the substrate, the pothole is a little larger than the substrate. Thus when the substrate is in position, there is a narrow gap around the edge of the substrate, which may have a width of about 0.5 to 1 mm and a similar depth.

As can be most clearly seen in FIGS. 7 to 9, the seal member or liquid confinement structure 12 rides close to the upper surface of the substrate/substrate table so that a narrow gap is formed in region D to reduce leakage of the immersion fluid. The immersion fluid is further confined by a two-phase extraction passage 23, a gas extraction passage 22 and a gas supply passage 21 which forms a gas knife to drive inwardly any liquid remaining on the surface of the substrate W. A single (liquid) phase extractor may also be used in place of the two-phase extractor.

Figure 6:
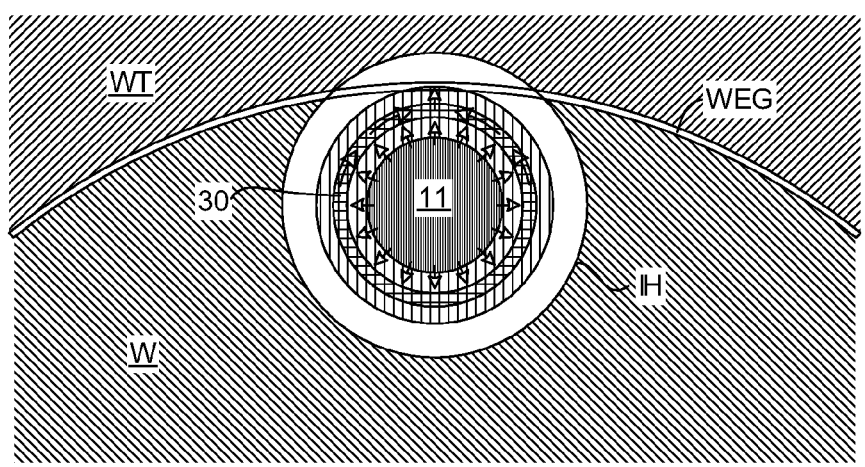
FIG. 6 depicts in plan the immersion hood of an embodiment of the invention passing over the substrate edge gap.

In FIG. 6, the region where immersion liquid (e.g. ultra pure water) is present is shown with vertical hatching. In a central area encompassing the exposure field, shown with darker hatching, the immersion liquid completely fills the space between the substrate W and projection system PL so there is a considerable volume of liquid. Around that there is an annular region, shown in lighter hatching, where there is only a thin layer of immersion liquid, sandwiched in a narrow gap between the seal member 12 and the substrate W. The narrowness and width of this gap serve to confine the immersion liquid in the central area and reduce leakage. This region is referred to as the buffer. The buffer may in some embodiments, where the gap between the bottom of the seal member 12 and the substrate is small, function to damp vibrations of the substrate table WT and seal member 12 and therefore may also be referred to as the damper. In embodiments where the gap between the seal member and substrate is large, the buffer region may have little or no damping effect.

However, the volume of liquid in the buffer and the flow rate through it may be insufficient to quickly fill the substrate edge gap as the immersion hood passes over it. Thus air (or gas) can be left in the substrate edge gap WEG when the central area of the immersion hood passes over it. The greater volume of liquid in this area provides liquid to fill the gap but the displaced air (or gas) may be a significant source of bubbles in the central region. These bubbles may cause printing defects before they are removed from the exposure field.

According to an embodiment of the invention therefore, a recess 30 (which in this embodiment is annular but may be another shape) is provided in the underside of the seal member 12, outside the central area and in the buffer region. The recess 30 is normally full of the immersion liquid and functions to limit or prevent bubbles by enabling faster filling of the substrate edge gap WEG. This occurs in two ways. Firstly, as shown in FIGS. 8 and 9, the recess 30 provides an additional volume of liquid that can flow directly into the substrate edge gap and secondly, the recess provides a flow path enabling the immersion liquid to flow peripherally (in this case, circumferentially) to fill the gap, as shown in FIG. 6. At the same time however, the recess does not substantially reduce the radial flow resistance provided by the buffer region. In an embodiment, the recess has a volume comparable to the volume of the substrate edge gap to be filled, which can be achieved if the vertical cross-sectional area is from a half to twice that of the substrate edge gap. The liquid may be provided at an overpressure in the recess 30, to increase the speed of filling. With this embodiment, it is possible to arrange that the substrate edge gap will be filled within a few milliseconds, preventing or strongly limiting gas escaping into the exposure field.

Although the recess is shown as extending completely around the periphery (e.g., a complete annulus), it may be interrupted in one of more places provided the recess has sufficient volume and length to enable filling of the substrate edge gap in the desired time. Also, if the immersion hood will only approach the substrate edge in a limited number or range of directions, the recess may be provided only where necessary and not all around the seal member.

Figure 10:
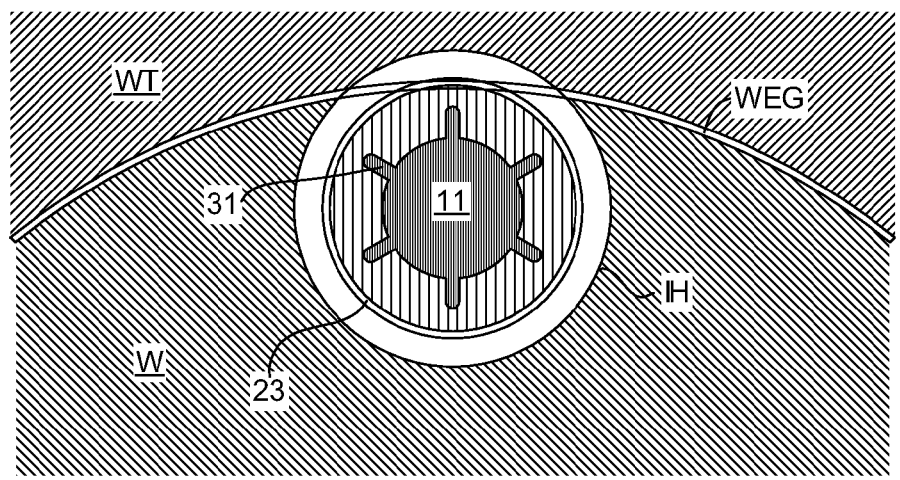
FIG. 10 depicts in plan the immersion hood of another embodiment of the invention passing over the substrate edge gap.

Another embodiment, that is a variation of the first embodiment, is shown in FIG. 10. In this embodiment, in place of a peripheral (e.g., annular) recess 30, a plurality, in this case six, of channels 31 (in this case, extending radially although they may arranged in other directions as appropriate) are provided. The channels are recessed into the underside of the seal member 12 and extend outward from the central reservoir. The dimensions—depth, width and length—and number of the channels is selected to provide a flow path from the reservoir to the substrate edge gap WEG that is sufficient to fill the gap as fast as required, while at the same time minimizing leakage of the immersion fluid. Leakage can be prevented by ensuring that the channels do not extend as far as the one- or two-phase extraction passage 23. A suitable number of recesses is from 4 to 8. In an embodiment, the geometry of the channels 31 is such that the substrate edge gap WEG will only be filled from one channel at a time, when approached from certain directions that will be used in production. For this reason, in an embodiment, the ends of the recesses all lie on a circle.

Figure 11:
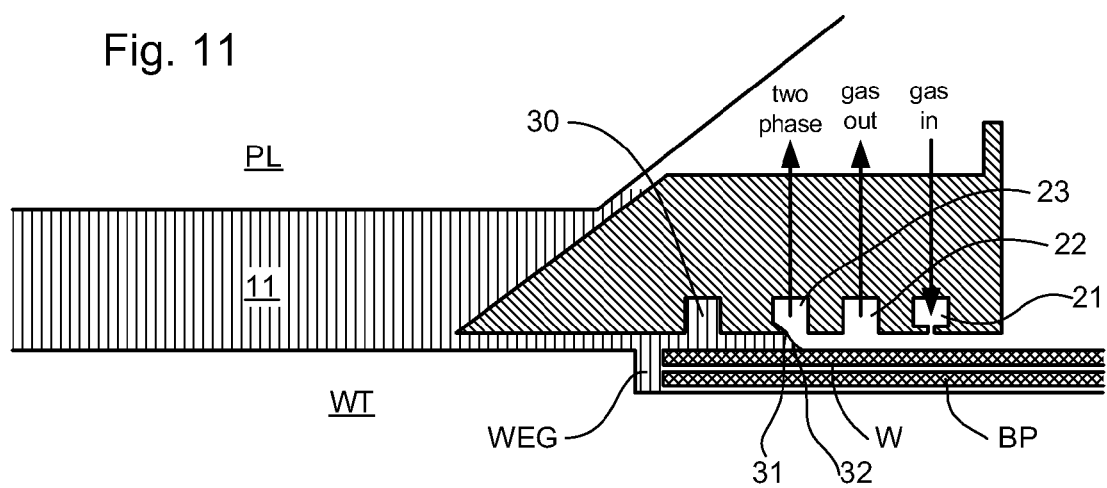
FIG. 11 depicts in section the immersion hood of another embodiment of the invention.

A further embodiment of the invention is shown in FIG. 11. This embodiment is essentially the same as the embodiments described above, save that the underside of the seal member 12 is provided with a sharp, hydrophilic edge 31 to control the position of the meniscus 32 of the immersion liquid. (In this context hydrophilic is used to mean that the material of the edge has a contact angle to the immersion liquid of less than 90°, whether or not the immersion liquid is water.) The sharp edge 31 is conveniently positioned at the edge of the buffer region D and limits or prevents the bubbly liquid-gas mixture that is present outside the buffer region from passing into the buffer region.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed:

1. A device manufacturing method, comprising:
   confining liquid to a space between a projection system of a lithographic projection apparatus and a substrate using a liquid confinement structure of the lithographic projection apparatus, the confinement structure having a buffer surface and an edge positioned in close proximity to a plane substantially comprising the upper surface of the substrate and of a substrate table holding the substrate, to define a passage having a flow resistance, the edge controlling the position of a meniscus of the liquid located between the buffer surface and the plane and the edge located at the juncture of at least two surfaces at an acute angle to each other; and
   projecting a patterned beam of radiation, using the projection system, through liquid in the space onto the substrate.

2. The method of claim 1, wherein the edge is hydrophilic.

3. The method of claim 1, wherein a surface of the edge has a contact angle with respect to the liquid of less than 90 degrees.

4. The method of claim 1, wherein the edge is positioned at an outer periphery of the buffer surface.

5. The method of claim 1, wherein the edge limits, prevents, or both limits and prevents, a mixture of gas and liquid present outside a buffer region defined by the buffer surface from passing into the buffer region.

6. The method of claim 1, further comprising supplying a gas using a gas knife to drive liquid toward an optical axis of the projection system.

7. The method of claim 6, wherein the gas knife comprises a passage to extract liquid, a passage to extract substantially only gas, and a passage to supply gas.

8. The method of claim 6, wherein the edge is located inward, relative to an optical axis of the projection system, of the gas knife.

9. A lithographic apparatus arranged to project a patterned beam of radiation from a patterning device, through a liquid, onto a substrate, the apparatus comprising:
   a projection system configured to project the patterned beam of radiation onto the substrate along an optical axis; and
   a liquid confinement structure configured to at least partly confine the liquid to a space between the projection system and the substrate, wherein a surface of the confinement structure has a buffer surface positioned, when in use, in close proximity to a plane substantially comprising the upper surface of the substrate and of a substrate table configured to hold the substrate, to define a passage having a flow resistance, the surface located between the projection system and the substrate table, and the surface of the confinement structure has a recess for liquid between the optical axis and a liquid extraction outlet, in the surface, the liquid extraction outlet being the nearest outlet or inlet to the recess and being the only liquid extraction outlet or the nearest liquid extraction outlet to the optical axis on the bottom of the liquid confinement structure.

10. The lithographic apparatus of claim 9, further comprising an edge radially outward or at the periphery of the buffer surface, the edge located at the juncture of at least two surfaces at an acute angle to each other.

11. The lithographic apparatus of claim 10, wherein the edge is radially outward of the recess.

12. The lithographic apparatus of claim 10, wherein a surface of the edge forms, in use, a contact angle with respect to the liquid of less than 90 degrees.

13. The lithographic apparatus of claim 10, wherein the edge, in use, controls the position of a meniscus of the liquid located between the buffer surface and the plane.

14. The lithographic apparatus of claim 9, wherein the recess, in use, is normally full of liquid to enable rapid filling of a gap between the substrate and the substrate table as the gap moves under the buffer surface.

15. A device manufacturing method, comprising:
   projecting a patterned beam of radiation, using a projection system of a lithographic projection apparatus, along an optical axis and through a liquid, in a space between the projection system and a substrate, onto the substrate; and
   confining the liquid to the space using a liquid confinement structure of the lithographic projection apparatus, a surface of the confinement structure having a buffer surface positioned in close proximity to a plane substantially comprising the upper surface of the substrate and of a substrate table holding the substrate, to define a passage having a flow resistance, the surface located between the projection system and the substrate table, and the surface of the confinement structure has a recess for liquid between the optical axis and a liquid extraction outlet, in the surface, the liquid extraction outlet being the nearest outlet or inlet to the recess and being the only liquid extraction outlet or the nearest liquid extraction outlet to the optical axis on the bottom of the liquid confinement structure.

16. The method of claim 15, wherein the surface of the confinement structure comprises an edge radially outward or at the periphery of the buffer surface, the edge located at the juncture of at least two surfaces at an acute angle to each other.

17. The method of claim 16, wherein the edge is radially outward of the recess.

18. The method of claim 16, wherein a surface of the edge forms a contact angle with respect to the liquid of less than 90 degrees.

19. The method of claim 16, wherein the edge controls the position of a meniscus of the liquid located between the buffer surface and the plane.

20. The method of claim 15, further comprising providing liquid in the recess to enable rapid filling of a gap between the substrate and the substrate table as the gap moves under the buffer surface.

* * * * *